United States Patent
Schindler et al.

[11] Patent Number: 6,136,659
[45] Date of Patent: Oct. 24, 2000

[54] PRODUCTION PROCESS FOR A CAPACITOR ELECTRODE FORMED OF A PLATINUM METAL

[75] Inventors: Günther Schindler; Walter Hartner; Volker Weinrich, all of München; Carlos Mazure-Espejo, Zorneding, all of Germany

[73] Assignee: Infineon Technologies AG, Munich, Germany

[21] Appl. No.: 09/047,850

[22] Filed: Mar. 25, 1998

[30] Foreign Application Priority Data

Mar. 25, 1997 [DE] Germany .................... 197 12 540

[51] Int. Cl.[7] ................. H01L 21/20; H01L 21/8242
[52] U.S. Cl. ................. 438/386; 438/387; 438/396; 438/243; 438/244; 438/253
[58] Field of Search .................... 438/253, 254, 438/256, 387, 396, 397, 399, 686, 682, 3, 243, 244

[56] References Cited

U.S. PATENT DOCUMENTS

| | | | |
|---|---|---|---|
| 5,786,259 | 7/1998 | Kang | 438/396 |
| 5,899,714 | 5/1999 | Farrenkopf et al. | 438/202 |
| 5,903,053 | 5/1999 | Iijima et al. | 257/751 |
| 6,008,124 | 12/1999 | Sekiguchi et al. | 438/653 |

FOREIGN PATENT DOCUMENTS

0697719A2  2/1996  European Pat. Off. .

OTHER PUBLICATIONS

"Observations on the formation and etching of platinum silicide", Myron J. Rand et al., Appl. Phys. Lett., vol. 24, No. 2, Jan. 15, 1974, pp. 49–51.

*Primary Examiner*—Mary Wilczewski
*Assistant Examiner*—James Park
*Attorney, Agent, or Firm*—Herbert L. Lerner; Laurence A. Greenberg; Werner H. Stemer

[57] ABSTRACT

A production process for a capacitor electrode formed of a platinum metal includes producing a conductive electrode body on a substrate having a silicon-containing surface for the capacitor electrode. Platinum is deposited over the full surface, the platinum is silicized in a temperature step outside the electrode body and the platinum silicide is removed. The advantage of the invention is the avoidance of an etching process for metallic platinum.

17 Claims, 4 Drawing Sheets

PRODUCTION PROCESS FOR A CAPACITOR ELECTRODE FORMED OF A PLATINUM METAL

BACKGROUND OF THE INVENTION:

Field of the Invention:

The invention relates to a production process for a capacitor electrode formed of a platinum metal in an integrated semiconductor circuit.

One example of a semiconductor circuit with a capacitor is a DRAM memory cell. In order to increase the scale of integration thereof, it can be constructed as a so-called stacked capacitor cell, in which the memory capacitor is located outside the associated selection transistor. The choice of the capacitor dielectric, among other factors, has a substantial influence on the space required by such a capacitor.

Conventional capacitors usually use silicon oxide or silicon nitride layers as the storage dielectric, and those layers have a maximum dielectric constant of 8. New paraelectrical materials, such as BST (barium strontium titanate, $BaSrTiO_3$) and the like have a dielectric constant $\in > 150$ and thus make a smaller capacitor possible.

Such memory elements with a paraelectric material as their capacitor dielectric (DRAM) lose their charge if the supply voltage fails and thus they lose the information stored in them. Moreover, conventional memory elements must be constantly rewritten (refresh time) because of the residual leakage current. The use of a ferroelectric material as a storage dielectric provides different directions of polarization, which makes it possible to construct a non-volatile memory that does not lose its information if the supply voltage fails and does not have to be refreshed constantly. The residual leakage current from that cell does not affect the signal stored in memory. One example of such a ferroelectric material is PZT (lead zirconium titanate, $Pb(Zr, Ti)O_3$).

In general, those novel ferroelectrics and paraelectrics are produced at high temperatures in an oxidizing atmosphere. Therefore, a material is needed that is compatible with those conditions, particularly for the first capacitor electrode.

In most cases, an electrode of a noble metal such as platinum, iridium or ruthenium (generally referred to as "platinum metals") is used. However, the structuring of platinum metals, especially with a relatively thick platinum layer, for instance, is so far a largely unsolved problem, since until now no suitable etching process has been developed, and since no volatile platinum compounds appear suitable for RIE processes. Previous etching processes have been based on the application of a resist mask and on etching in argon, oxygen or chlorine plasmas. Due to the high physical component of the process, only slight selectivity with regard to mask materials and the underlying material can be attained.

SUMMARY OF THE INVENTION:

It is accordingly an object of the invention to provide a production process for a capacitor electrode formed of a platinum metal, which overcomes the hereinafore-mentioned disadvantages of the heretofore-known methods of this general type and in which the production process is also capable of integration into a production process for a DRAM cell with a high-$\in$ paraelectric or a ferroelectric as a storage dielectric.

With the foregoing and other objects in view there is provided, in accordance with the invention, a production process for a capacitor electrode formed of a platinum metal in an integrated semiconductor circuit, which comprises producing a substrate for a capacitor electrode having a silicon-containing surface; producing a conductive electrode body on the silicon-containing surface, the electrode body substantially having a geometrical shape of the capacitor electrode to be created, for exposing the silicon-containing surface adjacent the electrode body; depositing a layer of a platinum metal; performing a temperature step for silicizing a region of the platinum metal resting on the silicon-containing surface; and removing the platinum metal silicide.

The invention is based on the use of a salicide (self-aligned silicide) process for producing the capacitor electrode. To that end, a substrate with a silicon-containing surface is first created. The substrate is in particular a semiconductor substrate, optionally with circuit elements that have already been created.

Then, in accordance with a feature of the invention, a conductive layer is deposited and structured to form an electrode body. This electrode body has substantially the same shape as the capacitor electrode to be created. The a-Si surface is bare or exposed outside the electrode body. A platinum layer is deposited conformally over the electrode body. Through the use of a temperature process, the platinum that rests on the silicon-containing surface is silicized, or in other words converted into $PtSi_x$. The $PtSi_x$ is then selectively etched, while the platinum which is present on the electrode body is not attached. A suitable etching process is described in an article by M. Rand et al, in Appl. Phys. Lett., 24 (1974), p. 49. The protective oxide layer of platinum silicide is removed in HF and an ensuing etching in nitrohydrochloric acid etches the platinum silicide faster than the metallic platinum. Any silicon oxide that remains behind can be removed again with HF.

A substantial advantage of the invention is that no etching process for metallic platinum is needed. Instead, a more easily structured conductive substitute material is etched to form an electrode body. The platinum layer on the electrode body is then self-adjusted to the electrode body. In other words, no further mask is needed for this purpose.

The Si-containing substrate surface may be a polysilicon layer. Preferably, it is an a-Si layer (amorphous silicon layer), because that is especially well suited to silicide formation. Depending on the construction of the substrate, it is advantageous to provide a layer of an etch stop material, such as silicon nitride, underneath the Si layer on the surface of the substrate. This protects the portion of the substrate located beneath it in the later silicide etching.

The silicon-containing surface may have to be protected by a thin oxide film which is created, for instance, by oxidation, during the ensuing processes (such as during the production of the electrode body). This thin oxide film is removed again later, in particular before the platinum deposition.

In order to connect the electrode, optionally after the Si layer has been produced or after the possible oxide protection layer has been made, for instance, a contact hole is etched into the substrate and optionally into these layers down to an underlying conductive structure. In the case of a DRAM memory cell, the connection with the source/drain region of the associated selection transistor can be made in this way.

If the memory cell has a high-$\in$ dielectric or a ferroelectric as its storage dielectric, then an oxygen diffusion barrier must be provided between it and the next lower-lying oxidizable structure, so that the contact with the S/D zone will not be impaired by oxidation. To that end, the electrode body and/or a connection structure that fills the contact hole may be formed of a conductive oxygen barrier material. However, it is also possible to produce both of these structures of polysilicon or tungsten, for instance, and to form a barrier that is self-adjusted on the electrode body, for instance by deposition or through the use of a temperature process.

With the objects of the invention in view there is also provided a production process for a capacitor electrode formed of a platinum metal in an integrated semiconductor circuit, which comprises producing a substrate with an insulation layer and applying a silicon layer on the insulation layer; creating an opening in the silicon layer having lateral dimensions substantially equal to a capacitor electrode to be created; depositing a layer of a platinum metal; performing a temperature step for silicizing a region of the platinum metal layer resting on the silicon layer; and removing the platinum metal silicide.

Other features which are considered as characteristic for the invention are set forth in the appended claims.

Although the invention is illustrated and described herein as embodied in a production process for a capacitor electrode formed of a platinum metal, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
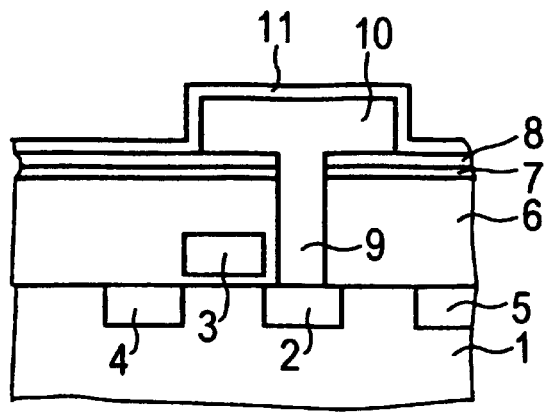
FIGS. 1–3 are fragmentary, diagrammatic, cross-sectional views of a semiconductor configuration in connection with which a first exemplary embodiment of the process will be explained.

Referring now to the figures of the drawings in detail and first, particularly, to FIG. 1 thereof, there is seen a DRAM memory cell which is used as an example for explaining the process according to the invention. An MOS transistor which is made with doped regions 2, 4 (source/drain) and a gate 3 in a silicon semiconductor substrate 1, is separated from a transistor of an adjacent memory cell by an insulation zone 5. The configuration is covered with an insulation layer 6, such as silicon oxide. A layer of $Si_3N_4$ as an etch stop material 7 that is about 150 nm thick, and a layer of amorphous silicon 8, are deposited onto the surface of the insulation layer 6 by known methods. In this way, a substrate is formed for the capacitor electrode. The thickness of the a-Si layer is preferably less than 200 nm, for instance 100 nm, so that the PtSi etching that will later be necessary can be kept brief. The amorphous silicon 8 may have to be protected during ensuing steps (in particular during structuring of the electrode body) by a thin non-illustrated oxide film that is removed again later. A contact hole is etched down to the S/D zone 2 with the aid of a phototechnique. A conductive connection structure 9 is then made in this contact hole. To that end, in a first embodiment, a conductive barrier material for preventing oxygen diffusion is applied over the entire surface, thus filling the contact hole and covering the surface of the configuration. A tungsten nitride layer that is approximately 500 nm thick can be applied by known methods (such as CVD) in order to provide a contact hole that is 0.8 μ in diameter, for instance. This WN layer is structured, thus creating an electrode body 10 disposed above the connection structure 9. The a-Si surface is laid bare outside the electrode body. Platinum 11 is deposited over the entire surface (to a thickness of approximately 100 nm) of the thus available surface.

Figure 2:
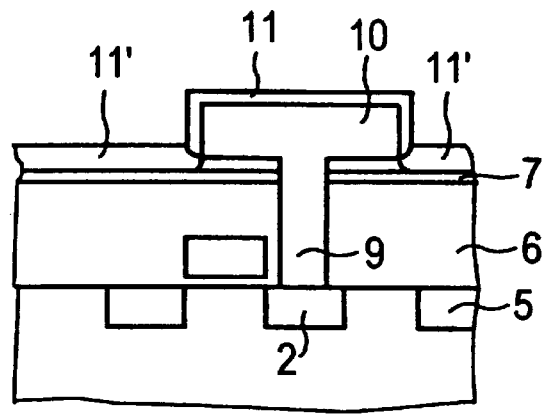

FIG. 2 shows that through the use of a temperature step, only the platinum located on the a-Si is silicized, while metallic platinum 11 remains on the electrode body 10. The temperature step may be performed in the form of RTP (rapid thermal processing) in nitrogen (1 min at 500°C.) or as an oven process in nitrogen or argon. The resultant platinum silicide 11' is then removed by a suitable wet etching method, as noted above.

Figure 3:
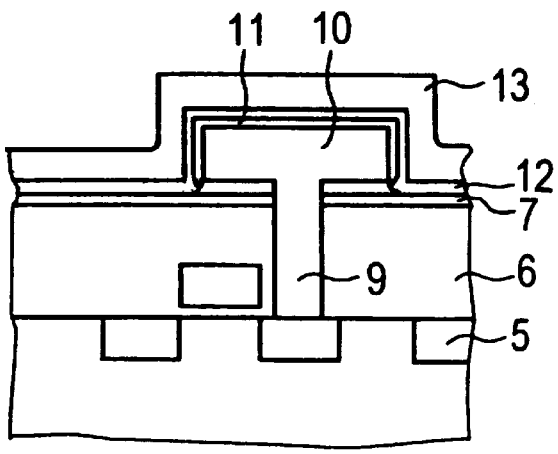

According to FIG. 3, a capacitor dielectric 12, preferably a high-∈ dielectric, is applied over the entire surface, in order to finish the storage capacitor. In the case of a FRAM, a ferroelectric is deposited instead. Since the electrode body 10 and the connection structure 9 are formed of an oxygen diffusion barrier, lower-lying structures are not oxidized in the process. An upper electrode 13 is then produced, for instance again from platinum.

Figure 4:
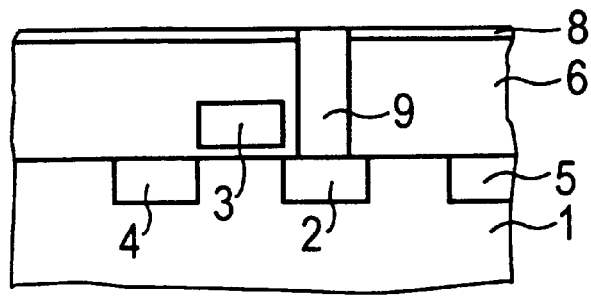
FIGS. 4–11 are fragmentary, cross-sectional views of further exemplary embodiments.
Figure 5:
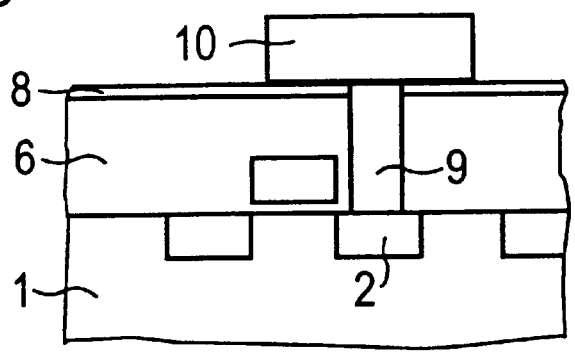

The following exemplary embodiments (FIGS. 4–9) only differ from the first exemplary embodiment in the production of connection structures 9, electrode bodies 10, and optionally an oxygen diffusion barrier, so that only these steps will be explained in conjunction with these figures:

In the embodiment according to FIGS. 4 and 5, in order to produce the connection structure 9, a conductive layer, such as polysilicon or tungsten, is introduced into the etched contact hole, preferably through the use of full-surface deposition and ensuing back etching down to the upper edge of the contact hole. An oxygen diffusion barrier is then deposited over the entire surface and structured to make the electrode body 10.

Figure 6:
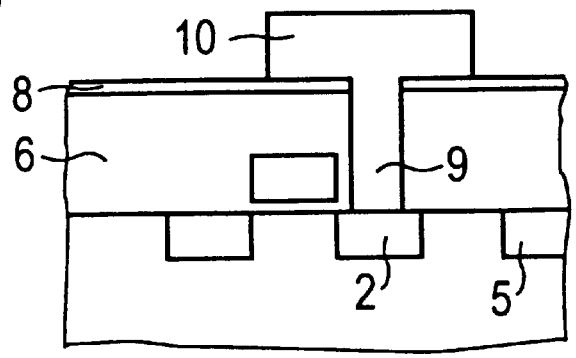
Figure 7:
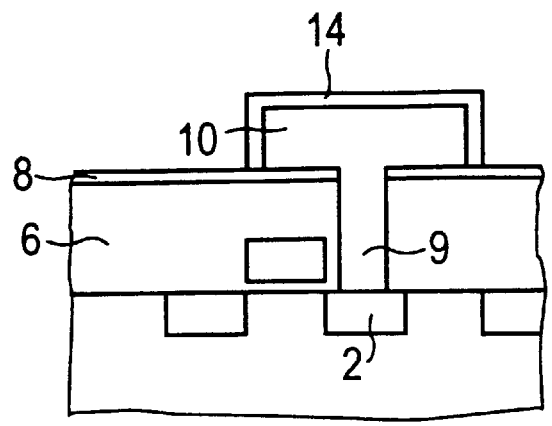

With regard to the embodiment of FIGS. 6 and 7, once the contact hole has been made, tungsten is deposited over the full surface and structured, thus forming the connection structure 9 and the electrode body 10. An oxygen diffusion barrier 14, which is disposed over the electrode body, can be made by rapid thermal processing (RTP) in a nitrogen-containing atmosphere, thus forming a WN layer 14 that is self-adjusted on the exposed surface of the electrode body 10.

Figure 8:
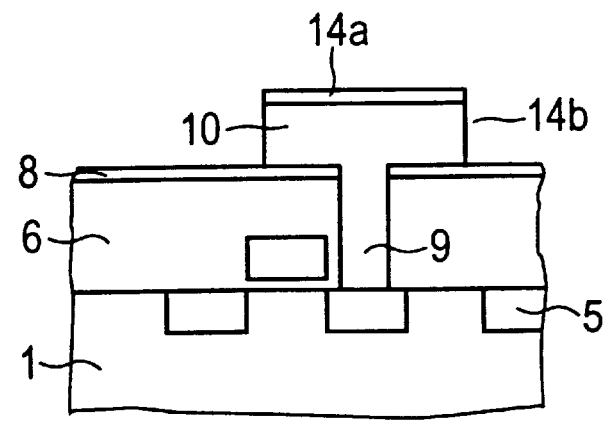
Figure 9:
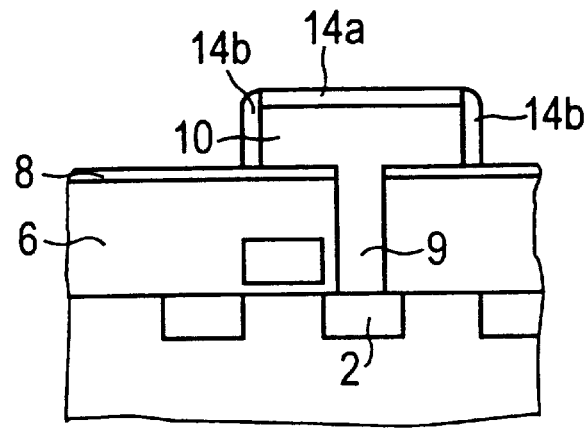

FIGS. 8 and 9 illustrate a fourth exemplary embodiment, in which polysilicon or tungsten, for instance, is applied over the full surface after the contact hole has been produced. WN, for instance, is deposited over that layer as an oxygen barrier 14a. This double layer 10, 14 is structured, thus forming an electrode body 10 having an upper surface which is already covered with an oxygen barrier 14a. A barrier 14b of WN is likewise created over the remaining exposed surface, that is the side walls of the electrode body 10, with the aid of a spacer technology (that is through the use of full-surface deposition and ensuing anisotropic back etching of the barrier material).

The rest of the process in this exemplary embodiment is performed as in the first example, that is platinum deposition, silicizing, etc.

Figure 10:
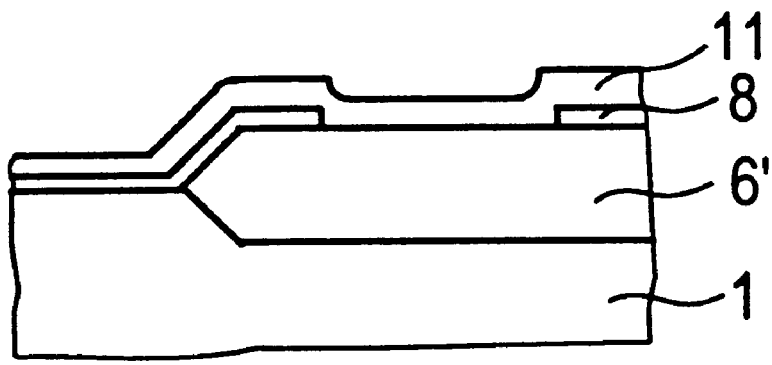
Figure 11:
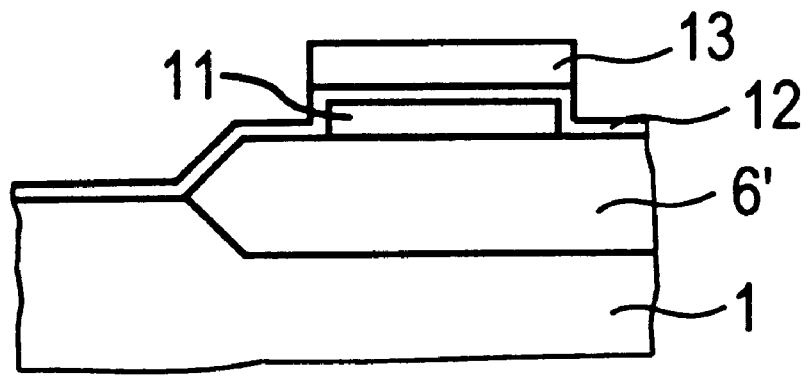

FIGS. 10 and 11 illustrate a process in which the storage capacitor can also be made in a so-called "top-contact" cell. In such a cell, which is shown in the drawing, the lower capacitor electrode is disposed with its entire surface over an insulating material, such as LOCOS. The electrical contact with the associated selection transistor is not made, with the aid of a first wiring plane of the circuit, until after the entire capacitor has been produced. Although the memory cell requires more surface area, it is simpler to produce. For instance, in most cases an oxygen barrier can be dispensed with. The production process differs from the basic process described previously above in that the capacitor electrode is defined not by an electrode body that covers the silicon-containing surface but rather by etching an opening into a silicon layer. The capacitor shown in the drawing, which uses the same reference numerals as in the previous exemplary embodiments, can be produced, for instance, as follows:

An amorphous or polycrystalline silicon layer 8 is deposited onto the insulation layer 6' (which in particular may also be an isolation zone that serves to isolate adjacent cells). An opening is then etched into this silicon layer 8 down to the underlying insulation layer. This opening defines lateral dimensions of the electrode to be produced, since no silicide can be formed inside the opening. Thus the opening has the same function as the electrode body made in the previous exemplary embodiments. The remainder of the process is as described at the outset (deposition of platinum or of a platinum metal, silicide formation, selective removal of the silicide, and completion of the capacitor). Thus the process produces platinum islands in the opening of the silicon layer 8.

We claim:

1. A production process for a capacitor electrode formed of a platinum metal in an integrated semiconductor circuit, which comprises:

producing a substrate for a capacitor electrode having a silicon-containing surface;

producing a conductive electrode body on the silicon-containing surface, the electrode body forming a part of the capacitor electrode and substantially having a geometrical shape of the capacitor electrode to be created, for exposing the silicon-containing surface adjacent the electrode body;

depositing a layer of a platinum metal;

performing a temperature step for silicizing a region of the platinum metal resting on the silicon-containing surface thereby producing a platinum metal silicide in said region; and removing the platinum metal silicide.

2. The production process according to claim 1, which comprises etching a contact hole to the substrate before producing the electrode body for receiving a connection structure in the contact hole, and extending the contact hole down to a conductive structure located below said silicon containing surface.

3. The production process according to claim 1, which comprises providing a silicon layer as said silicon containing surface of said substrate.

4. The production process according to claim 3, which comprises creating an oxide layer as a guard layer on the silicon layer.

5. The production process according to claim 3, which comprises applying an etch stop layer to the substrate beneath the silicon layer.

6. The production process according to claim 1, which comprises producing a barrier layer for preventing oxygen diffusion, before the platinum metal layer is deposited.

7. The production process according to claim 2, which comprises depositing a barrier layer over the entire surface after the contact hole is produced, and forming the connection structure and the electrode body from the barrier layer.

8. The production process according to claim 2, which comprises applying a conductive layer over the entire surface and etching back the conductive layer to the connection structure after the contact hole is produced, and then applying a barrier layer over the entire surface and structuring the barrier layer to form the electrode body.

9. The production process according to claim 2, which comprises applying a conductive layer entirely over said silicon-containing surface after the contact hole is produced, forming the connection structure and the electrode body from the conductive layer, and then forming an oxygen barrier on the exposed surface of the electrode body in a temperature process.

10. The production process according to claim 2, which comprises producing an oxygen diffusion barrier on side walls of the electrode body with a spacer technique.

11. A production process for a capacitor electrode formed of a platinum metal in an integrated semiconductor circuit, which comprises:

producing a substrate with an insulation layer and applying a silicon layer on the insulation layer;

creating an opening in the silicon layer having lateral dimensions substantially equal to lateral dimensions of a capacitor electrode to be created;

depositing a layer of a platinum metal;

performing a temperature step for silicizing a region of the platinum metal layer resting on the silicon layer thereby producing a platinum metal silicide in said region; and removing the platinum metal silicide.

12. The production process according to claim 1, which comprises subsequently applying a ferroelectric or a paraelectric over the created capacitor electrode, and applying another capacitor electrode over the ferroelectric or paraelectric.

13. The production process according to claim 11, which comprises subsequently applying a ferroelectric or a paraelectric over the created capacitor electrode, and applying another capacitor electrode over the ferroelectric or paraelectric.

14. The production process according to claim 1, which comprises depositing platinum as the platinum metal.

15. The production process according to claim 11, which comprises depositing platinum as the platinum metal.

16. The production process according to claim 1, which comprises producing a memory cell with the production process.

17. The production process according to claim 11, which comprises producing a memory cell with the production process.

* * * * *